(12) United States Patent
Shen et al.

(10) Patent No.: US 12,255,093 B2
(45) Date of Patent: Mar. 18, 2025

(54) 3D MEMORY STRUCTURE AND METHOD OF FORMING THE SAME

(71) Applicant: MACRONIX International Co., Ltd., Hsinchu (TW)

(72) Inventors: Kuan-Yuan Shen, Hsinchu County (TW); Chung-Hao Fu, Kaohsiung (TW); Chia-Jung Chiu, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 412 days.

(21) Appl. No.: 17/743,239

(22) Filed: May 12, 2022

(65) Prior Publication Data

US 2023/0369100 A1 Nov. 16, 2023

(51) Int. Cl.
*H10B 41/30* (2023.01)
*H01L 21/768* (2006.01)
(Continued)

(52) U.S. Cl.
CPC .... *H01L 21/76816* (2013.01); *H01L 23/5283* (2013.01); *H10B 41/30* (2023.02); *H10B 41/50* (2023.02); *H10B 43/50* (2023.02)

(58) Field of Classification Search
CPC ......... H10B 41/30; H10B 41/50; H10B 43/50
See application file for complete search history.

(56) References Cited

U.S. PATENT DOCUMENTS

| 8,928,149 B2 * | 1/2015 | Chen ................ H01L 21/76838 |
| | | 257/734 |
| 11,107,729 B2 * | 8/2021 | Lee ................... H01L 21/76877 |

(Continued)

FOREIGN PATENT DOCUMENTS

| JP | 2010192589 | 9/2010 |
| JP | 2014027104 | 2/2014 |

(Continued)

OTHER PUBLICATIONS

"Office Action of Korea Counterpart Application", issued on Apr. 25, 2023, with English translation thereof, pp. 1-13.

(Continued)

*Primary Examiner* — David A Zarneke
(74) *Attorney, Agent, or Firm* — J.C. PATENTS

(57) ABSTRACT

The present disclosure provides a 3D memory structure such as 3D Flash memory structure applying for 3D AND flash memory and a method of forming the same. An etching stop layer is formed on a substrate including active elements. A stacked layer is formed on the etching stop layer. The stacked layer includes insulation layers and sacrificed layers stacked alternatively on the etching stop layer. A patterning process is performed on the stacked layer to form a first stacked structure above the active elements, a second stacked structure surrounding the first stacked structure, and a trench pattern separating the first stacked structure and the second stacked structure and exposing the etching stop layer. The trench pattern includes asymmetric inner sidewalls and outer sidewalls. The inner sidewalls define sidewalls of the first stacked structure. The outer sidewalls define sidewalls of the second stacked structure that face the first stacked structure.

17 Claims, 13 Drawing Sheets

(51) Int. Cl.
    *H01L 23/528*   (2006.01)
    *H10B 41/50*    (2023.01)
    *H10B 43/50*    (2023.01)

(56) References Cited

U.S. PATENT DOCUMENTS

| | | | |
|---|---|---|---|
| 11,450,685 B2* | 9/2022 | Yoshida | H10B 43/50 |
| 11,991,881 B2* | 5/2024 | Tanaka | H10B 41/35 |
| 2014/0054789 A1* | 2/2014 | Chiu | H01L 23/522 |
| | | | 257/774 |
| 2022/0252804 A1* | 8/2022 | Möhlinger | G02B 6/4292 |
| 2022/0262720 A1* | 8/2022 | Tachi | H01L 23/528 |
| 2022/0285271 A1* | 9/2022 | Niihara | H10B 43/27 |
| 2022/0293529 A1* | 9/2022 | Horibe | H10B 43/27 |
| 2022/0328511 A1* | 10/2022 | Chung | H10B 41/41 |
| 2022/0399274 A1* | 12/2022 | Iijima | H01L 23/5226 |
| 2022/0399369 A1* | 12/2022 | Son | H10B 41/10 |
| 2023/0005949 A1* | 1/2023 | Lee | H01L 28/60 |

FOREIGN PATENT DOCUMENTS

| | | |
|---|---|---|
| JP | 2021174925 | 11/2021 |
| JP | 2022020276 | 2/2022 |
| KR | 20110087870 | 8/2011 |
| KR | 20200110052 | 9/2020 |
| TW | 471934 | 2/2015 |
| TW | 543297 | 7/2016 |
| TW | 630709 | 7/2018 |
| TW | 202205518 | 2/2022 |

OTHER PUBLICATIONS

"Office Action of Japan Counterpart Application", issued on Aug. 24, 2023, p. 1-p. 8.

"Notice of Allowance of Japan Counterpart Application," issued on Jan. 26, 2024, p. 1-p. 3, in which the listed reference was/references were cited.

"Office Action of Taiwan Counterpart Application", issued on Nov. 16, 2022, p. 1-p. 6.

* cited by examiner

3D MEMORY STRUCTURE AND METHOD OF FORMING THE SAME

BACKGROUND OF THE INVENTION

1. Field of the Invention

The present invention relates to a semiconductor structure and a method of forming the same, and particularly relates to a three-dimensional (3D) memory structure and a method of forming the same.

2. Description of Related Art

Since a non-volatile memory (such as a flash memory) has the advantage of retaining stored data even in a power failure, the non-volatile memory device has become a widely adopted memory in personal computers and other electronic equipment. With the development of process techniques, circuit design, and programming algorithms, the size of memory devices is significantly reduced in order to achieve a higher degree of integration. However, due to the limitation of the manufacturing process, the size of traditional planar memory devices may no longer meet the requirements of size reduction. Therefore, 3D flash memory devices are currently being developed to solve the above issue encountered by planar memories.

Nevertheless, as the size of electronic devices continues to shrink and uses' requirements for the performance of electronic devices continue to increase, those skilled in the art continue to improve the size and performance of memory devices used in electronic devices.

SUMMARY OF THE INVENTION

The present invention provides a 3D memory structure and a method of forming the same, which a trench pattern is designed to include asymmetric inner and outer sidewalls to reduce the occupied area of the second stacked structure being scribed in the subsequence processes and increase the occupied area of the first stacked structure that forms a 3D memory array in the subsequence processes. As such, it is benefic for reducing the size of the memory structure and increasing the performance (e.g., memory capacity) of the memory structure. The 3D memory structure of the present invention may be applied to a 3D AND flash memory.

An embodiment of the present invention provides a method of forming a 3D memory structure, which includes following steps. An etching stop layer is formed on a substrate including an active element. A stacked layer is formed on the etching stop layer. The stacked layer includes insulation layers and sacrificed layers alternatively stacked on the etching stop layer. A patterning process is performed on the stacked layer to form a first stacked structure disposed above the active element, a second stacked structure surrounding the first stacked structure, and a trench pattern separating the first stacked structure and the second stacked structure and exposing the etching stop layer. The trench pattern includes asymmetric inner and outer sidewalls. The inner sidewall defines a sidewall of the first stacked structure. The outer sidewall defines a sidewall of the second stacked structure that faces the first stacked structure.

Another embodiment of the present invention provides a method of forming a 3D memory structure, which includes following steps. An etching stop layer is formed on a substrate. A stacked layer is formed on the etching stop layer. The stacked layer includes insulation layers and sacrificed layers alternatively stacked on the etching stop layer. A patterning process is performed on the stacked layer to form stacked structures and a trench pattern separating the stacked structures and exposing the etching stop layer. The trench pattern includes first sidewalls and second sidewalls opposite to each other in a first direction and third sidewalls and fourth sidewalls opposite to each other in a second direction perpendicular to the first direction. Profiles of the first sidewalls and the second sidewalls are different from profiles of the third sidewalls and the fourth sidewalls.

An embodiment of the present invention provides a 3D memory structure including a substrate, an etching stop layer, a 3D memory array, and a second stacked structure. The substrate includes a memory cell region and a peripheral region surrounding the memory cell region. The etching stop layer is disposed on the substrate. The 3D memory array is disposed on the etching stop layer on the memory cell region and includes a first stacked structure including gate layers stacked on each other and electrically isolated from each other. The second stacked structure is disposed on the etching stop layer and surrounds the first stacked structure of the 3D memory array. The second stacked structure includes dummy gate layers stacked on each other and electrically isolated from each other. The first stacked structure includes first sidewalls that face the second stacked structure, the second stacked structure comprises second sidewalls that face the first stacked structure, the first sidewalls define an inner sidewall of a trench pattern, and the second sidewalls define an outer sidewall of the trench pattern. The inner sidewall and outer sidewall of the trench pattern are asymmetric.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
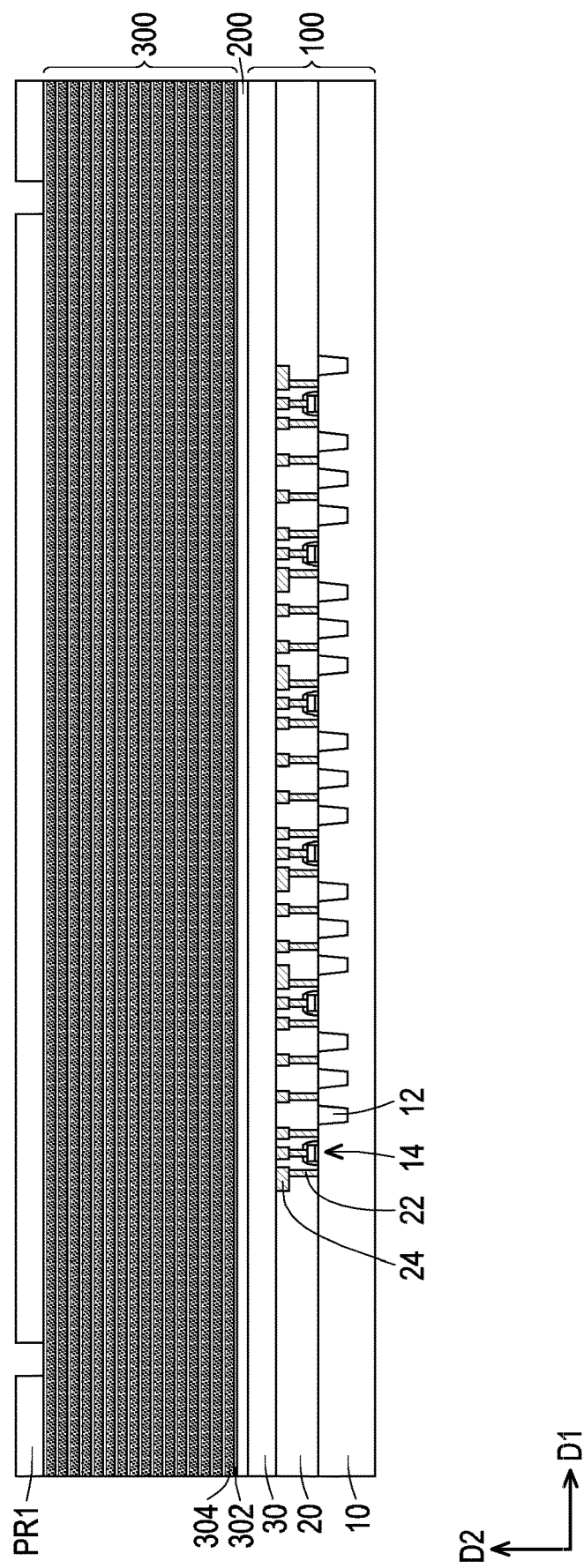
FIG. 1A to FIG. 1H are schematic cross-sectional views illustrating a method of forming a 3D memory structure according to an embodiment of the present invention.
Figure 1B:
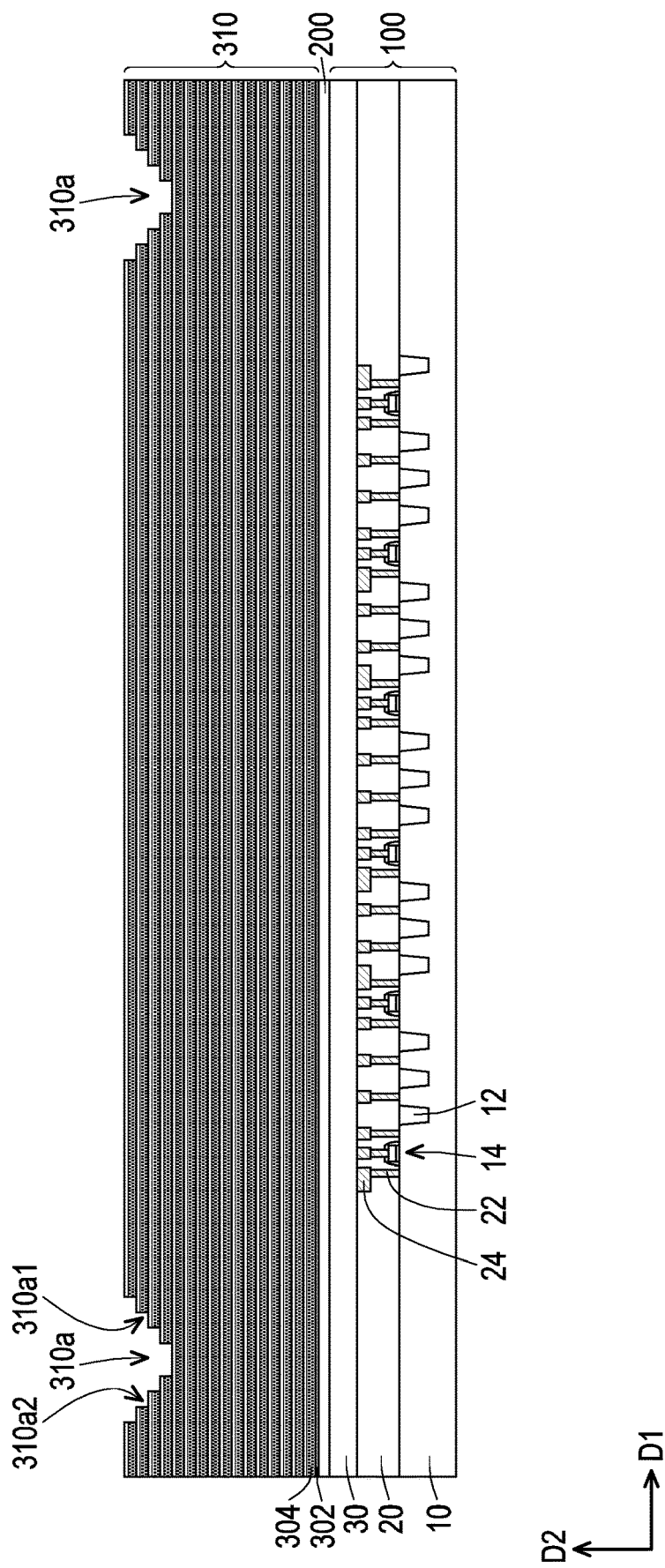
Figure 1C:
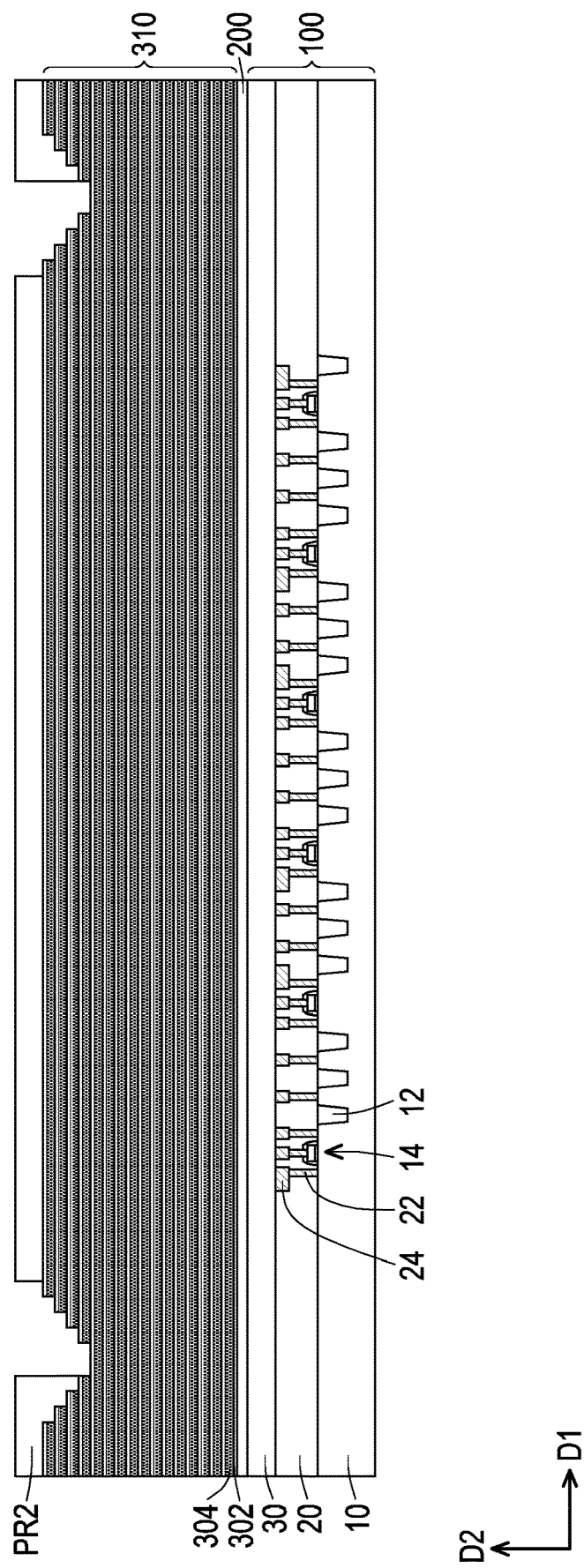
Figure 1D:
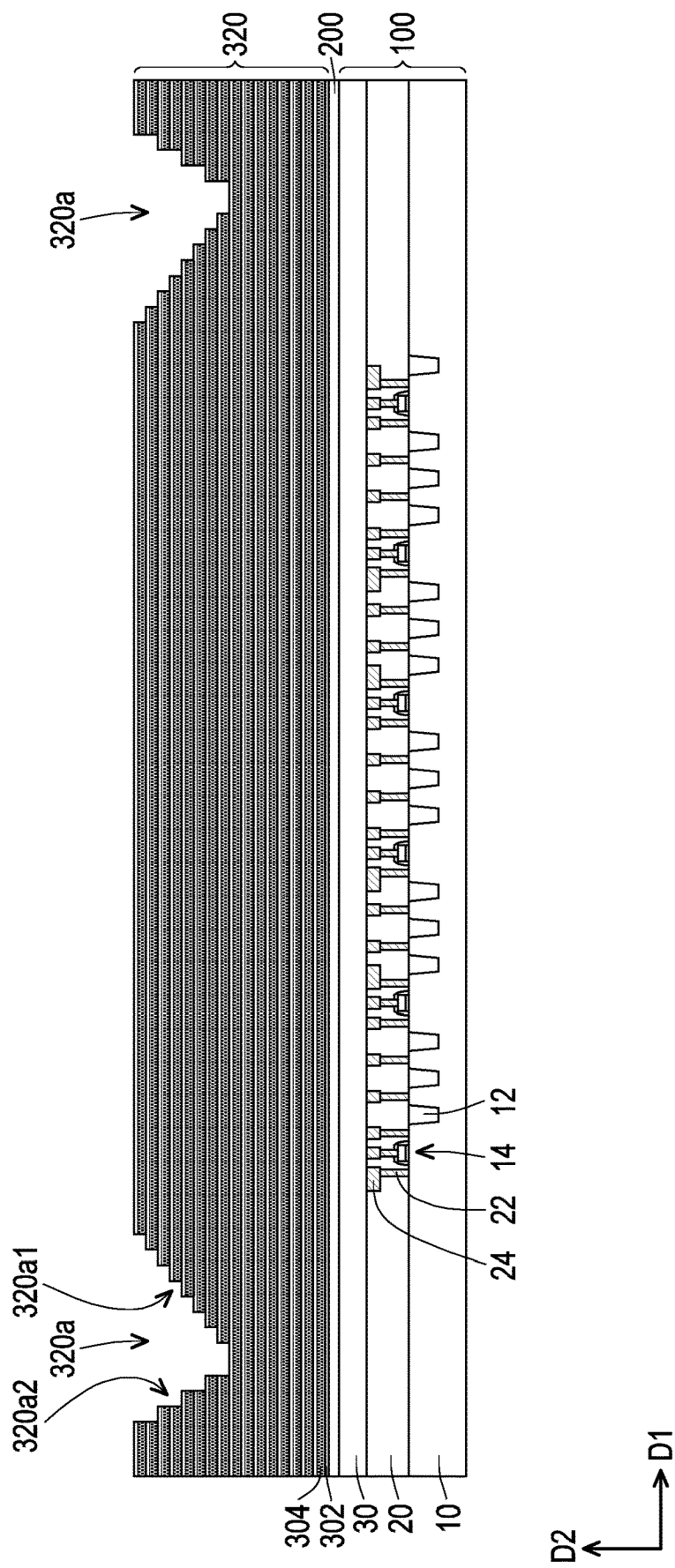
Figure 1E:
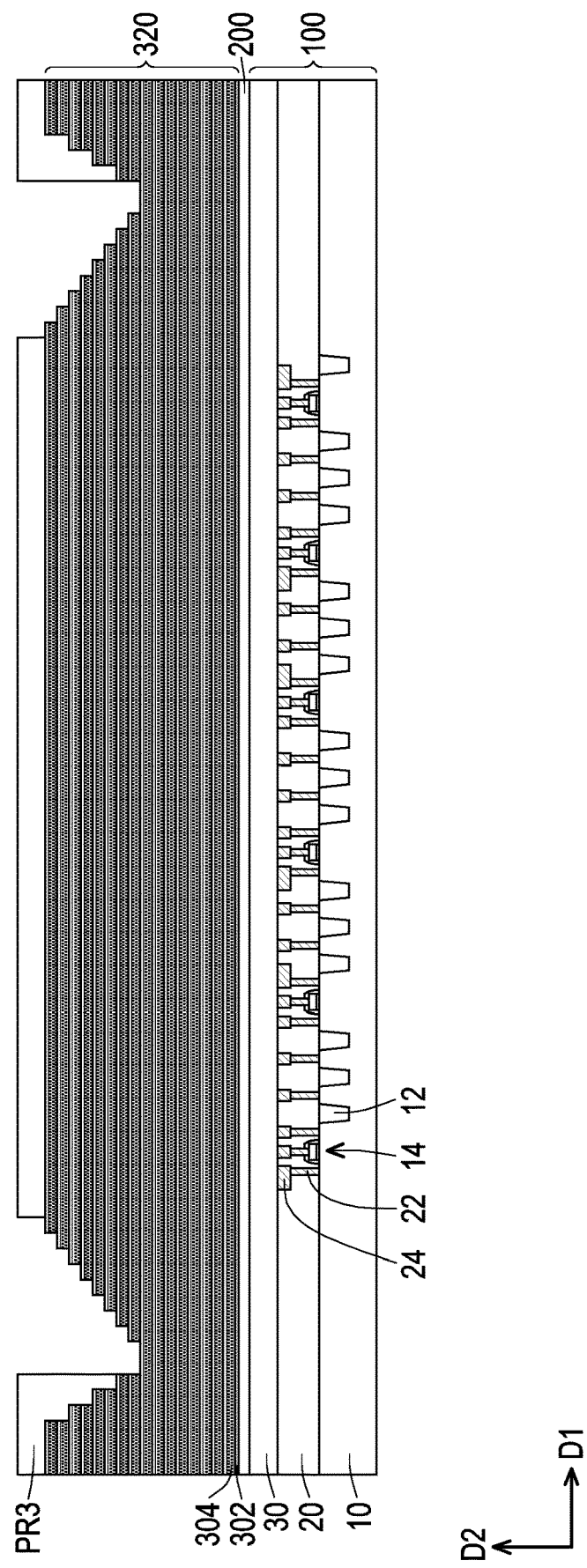
Figure 1F:
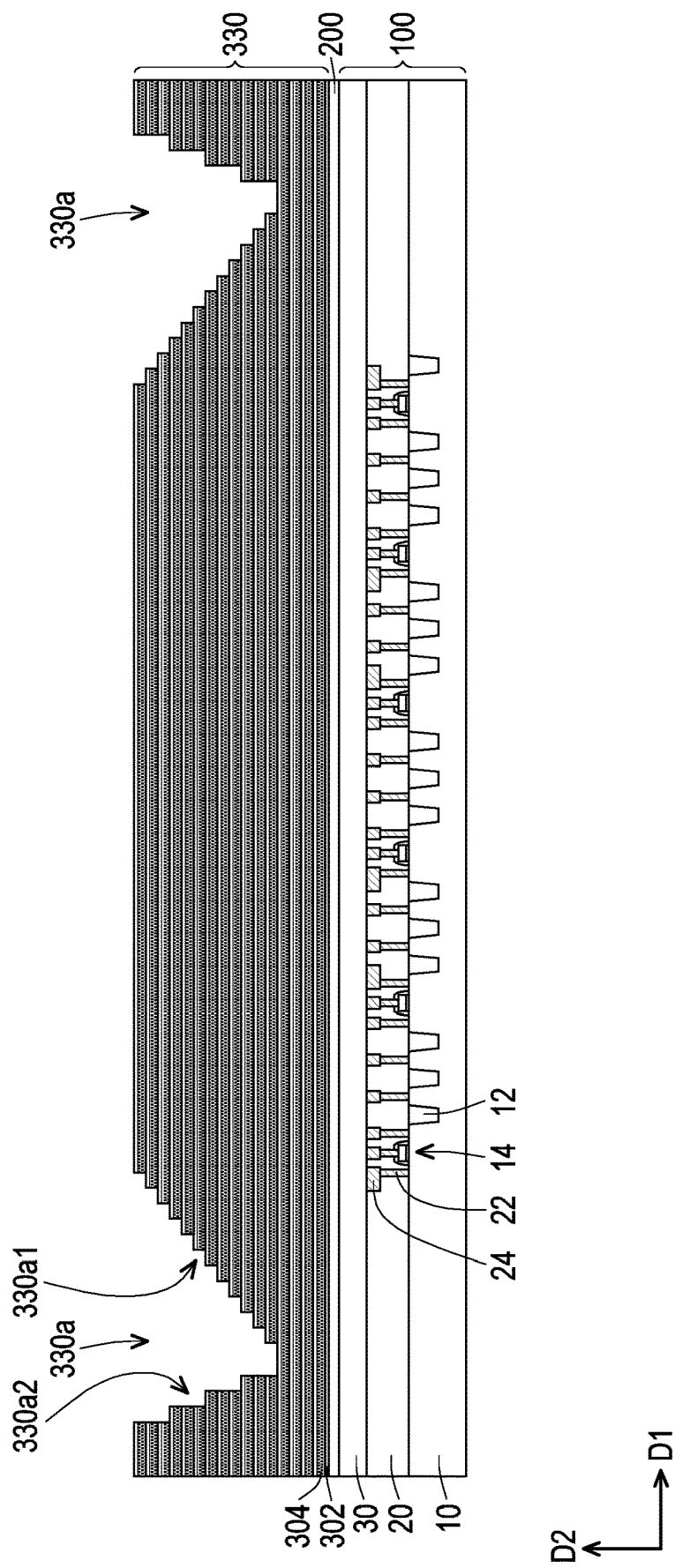
Figure 1G:
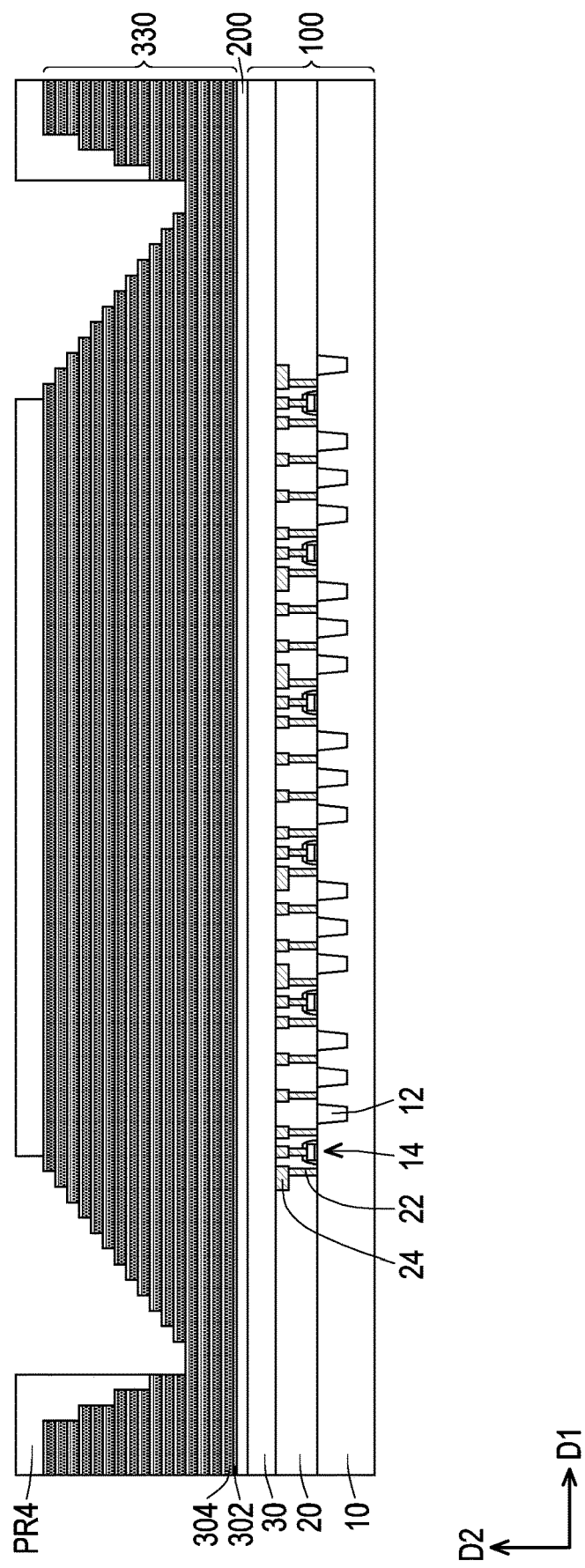

In the following detailed description, for purposes of explanation, numerous specific details are set forth in order to provide a thorough understanding of the disclosed embodiments.

It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements.

As used herein, "electrical connection" may refer to the concept including a physical connection (e.g., wired connection) and a physical disconnection (e.g., wireless connection).

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 2:
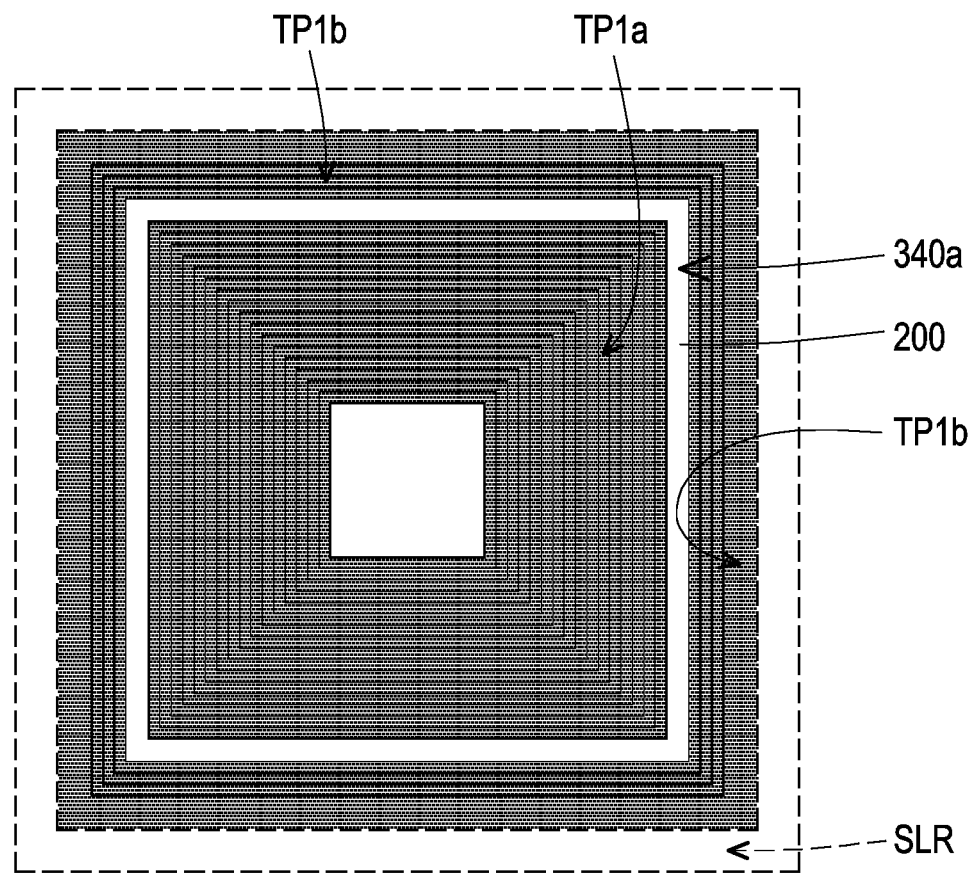
FIG. 2 is a schematic top view of FIG. 1H.
Figure 3:
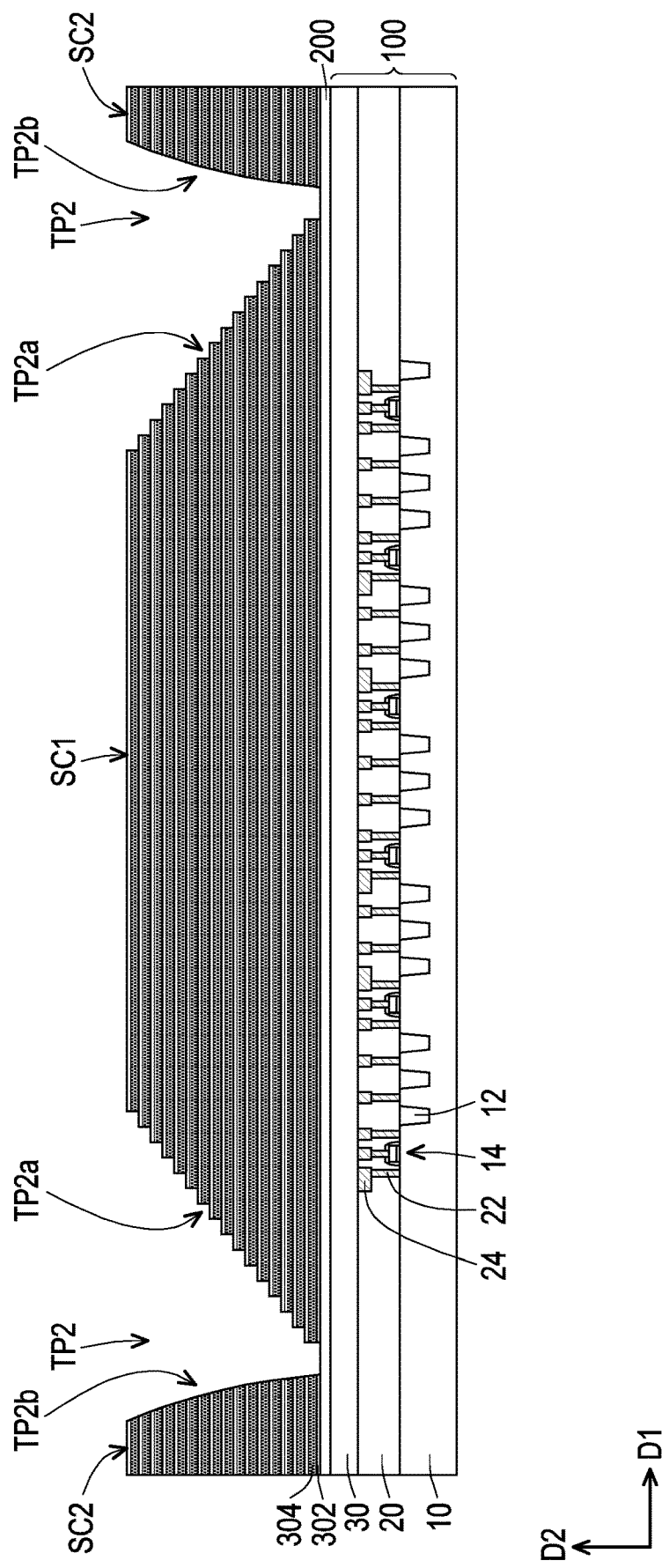
FIG. 3 is a schematic cross-sectional view illustrating a first stacked structure and a second stacked structure according to another embodiment of the present invention.
Figure 4:
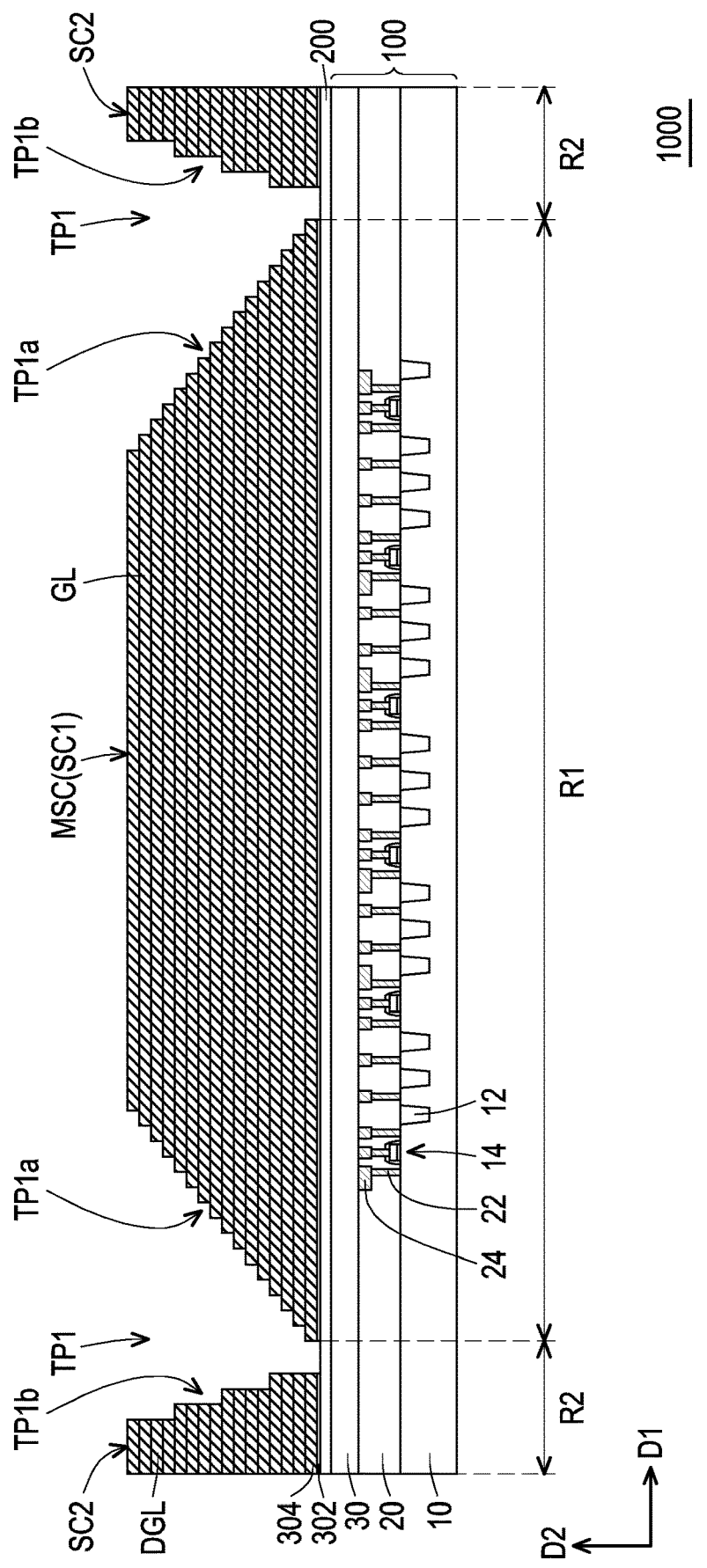
FIG. 4 is a schematic cross-sectional view of a 3D memory structure according to an embodiment of the present invention.

FIG. 1A to FIG. 1H are schematic cross-sectional views illustrating a method of forming a 3D memory structure according to an embodiment of the present invention. FIG. 2 is a schematic top view of FIG. 1H. FIG. 3 is a schematic cross-sectional view illustrating a first stacked structure and a second stacked structure according to another embodiment of the present invention. FIG. 4 is a schematic cross-sectional view of a 3D memory structure according to an embodiment of the present invention.

A method of forming a 3D memory structure (e.g., 3D memory structure 1000 shown in FIG. 4) includes following step.

Firstly, referring to FIG. 1A, an etching stop layer 200 is formed on a substrate 100. The substrate 100 may include a semiconductor substrate 10, an isolation structure 12, active elements 14, a dielectric layer 20, contacts 22, interconnection layers 24, and a dielectric layer 30.

The semiconductor substrate 10 may include a semiconductor material including an element semiconductor, an alloy semiconductor, or a compound semiconductor. For example, the element semiconductor may include Si or Ge. The alloy semiconductor may include SiGe, SiGeC, or the like. The compound semiconductor may include SiC, III-V semiconductor materials, or II-VI semiconductor materials. The semiconductor material may be doped with a dopant of a first conductivity type or a dopant of a second conductivity type complementary to the first conductivity type. For example, the first conductivity type may be n-type, whereas the second conductivity type may be p-type. The isolation structure 12 may be formed in the semiconductor substrate 10. The isolation structure 12 may include a shallow trench isolation structure. The material of the isolation structure 12 may include silicon oxide. The active elements 14 may be formed on the semiconductor substrate 10. The active elements 14 may include PMOS, NMOS, CMOS, JFET, BJT, or diodes. The dielectric layer 20 may be formed on the semiconductor substrate 10 and may cover the active elements 14. The material of the dielectric layer 20 may include a dielectric material such as silicon oxide. The contacts 22 may be formed in the dielectric layer 20 and may be electrically connected to the active elements 14. The materials of the contacts 22 may include conductive materials such as metals. The interconnection layers 24 may be formed in the dielectric layer 20 and may be electrically connected to the contacts 22. The materials of the interconnection layers 24 may include conductive materials such as metals. The dielectric layer 30 may be formed on the dielectric layer 20. The material of the dielectric layer 30 may include a dielectric material such as silicon oxide. The material of the etching stop layer 200 may include polysilicon.

Next, a stacked layer 300 is formed on the etching stop layer 200. The stacked layer 300 includes insulation layers 302 and sacrificed layers 304 alternatively stacked on the etching stop layer 200. The insulation layers 302 may be, for example, silicon oxide layers. The sacrificed layers 304 may be, for example, silicon nitride layers. FIG. 1A illustrates 17 layers of the insulation layers 302 and 16 layers of the sacrificed layers 304 as an exemplary embodiment for description, but is not limited thereto. The number of the insulation layers 302 and the sacrificed layers 304 can be adjusted according to the design.

Figure 1H:
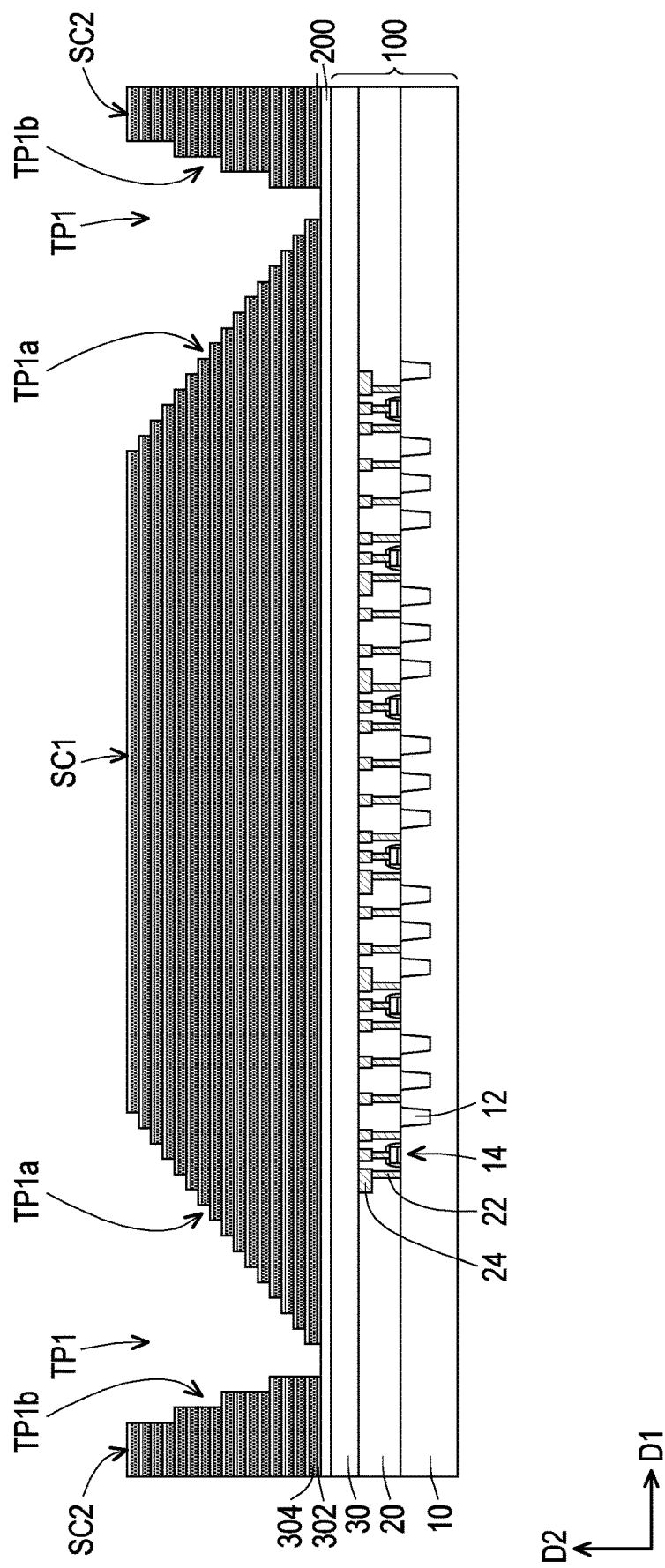

Then, A patterning process is performed on the stacked layer 300 to form a first stacked structure (e.g., a first stacked structure SC1 shown in FIG. 1H) disposed above the active elements 14, a second stacked structure (e.g., a second stacked structure SC2 shown in FIG. 1H) surrounding the first stacked structure, and a trench pattern (e.g., a trench pattern TP1 shown in FIG. 1H) separating the first stacked structure and the second stacked structure and exposing the etching stop layer 200. In the present embodiment, the trench pattern is formed to include asymmetric inner and outer sidewalls (as shown in FIG. 1H), such that the occupied area of the second stacked structure being scribed in the subsequence processes can be reduced and the occupied area of the first stacked structure that forms a 3D memory array in the subsequence processes can be increased. As such, it is benefic for reducing the size of the memory structure and increasing the performance (e.g., memory capacity) of the memory structure.

In some embodiments, the patterning process performed on the stacked layer 300 may include a first patterning process and a second patterning process.

In some embodiments, the first patterning process may include following steps. Firstly, referring to FIG. 1A, a first mask pattern PR1 is formed on the stacked layer 300. Then, referring to FIGS. 1A and 1B, a portion of the stacked layer 300 is removed by using the first mask pattern PR1 as a mask to form a stacked layer 310 including a first trench 310a. The first trench 310a may include asymmetric first and second sidewalls 310a1 and 310a2. In some embodiments, the first trench 310a may be formed by following steps.

Firstly, a first portion of the stacked layer 300 is removed, for example by etching, in a direction perpendicular to the substrate 100 (hereinafter direction D2) by using the first mask pattern PR1 as a mask. The first portion may include a portion of a topmost layer of the insulation layers 302 (hereinafter nth layer of the insulation layers 302) and a portion of a topmost layer of the sacrificed layers 304 (hereinafter kth layer of the sacrificed layers 304).

Then, a portion of the first mask pattern PR1 is removed laterally by performing a first trimming process on the first mask pattern PR1 in a direction parallel to the substrate 100 (hereinafter direction D1). After that, a second portion of the stacked layer 300 is removed in the direction D2 by using the first mask pattern PR1 being trimmed in the first trimming process as a mask. The second portion may include portions of the nth layer of the insulation layers 302 and the kth layer of the sacrificed layers 304 and portions of the (n−1)th layer of the insulation layers 302 and the (k−1)th layer of the sacrificed layers 304.

And then, a portion of the first mask pattern PR1 is removed laterally by performing a second trimming process on the first mask pattern PR1 in the direction D1. After that, a third portion of the stacked layer 300 is removed in the direction D2 by using the first mask pattern PR1 being trimmed in the second trimming process as a mask. The third portion may include portions of the nth layer of the insulation layers 302 and the kth layer of the sacrificed layers 304, portions of the (n−1)th layer of the insulation layers 302 and the (k−1)th layer of the sacrificed layers 304, and portions of the (n−2)th layer of the insulation layers 302 and the (k−2)th layer of the sacrificed layers 304.

And then, a portion of the first mask pattern PR1 is removed laterally by performing a third trimming process on the first mask pattern PR1 in the direction D1. After that, a fourth portion of the stacked layer 300 is removed in the direction D2 by using the first mask pattern PR1 being trimmed in the third trimming process as a mask. The fourth portion may include portions of the nth layer of the insulation layers 302 and the kth layer of the sacrificed layers 304, portions of the (n−1)th layer of the insulation layers 302 and the (k−1)th layer of the sacrificed layers 304, portions of the (n−2)th layer of the insulation layers 302 and the (k−2)th layer of the sacrificed layers 304, and portions of the (n−3)th layer of the insulation layers 302 and the (k−3)th layer of the sacrificed layers 304.

The first trench 310a formed by the foregoing steps may include first and second sidewalls 310a1 and 310a2 with staircase profiles. In some embodiments, as described above, steps of forming the first trench 310a may include performing three times of the trimming processes on the first mask pattern PR1 and performing four times of the removing processes such as etching on the stacked layer 300 by using those first mask patterns PR1 as masks, but the invention is not limited thereto. The number of performing the trimming processes and the removing processes may be adjusted according to the design. The first mask pattern PR1 is removed after forming the first trench 310a.

In some embodiments, the second patterning process may include following steps. Firstly, referring to FIG. 1B and FIG. 1C, a second mask pattern PR2 is formed on the stacked layer 310. The second mask pattern PR2 exposes the first sidewall 310a1 of the first trench 310a and covers the second sidewall 310a2 of the first trench 310a. The, referring to FIG. 1C and FIG. 1D, a portion of the stacked layer 310 is removed by using the second mask pattern PR2 as a mask to form a stacked layer 320 including a second trench 320a. The second trench 320a may include asymmetric first and second sidewalls 320a1 and 320a2. The second mask pattern PR2 is removed after forming the second trench 320a. In some embodiments, the second trench 320a may be formed by using the steps of forming the first trench 310a as described above, that is, the second trench 320a may include the first and second sidewalls 320a1 and 320a2 with staircase profiles. In some embodiments, steps of forming the second trench 320a may include performing three times of the trimming processes on the second mask pattern PR2 and performing four times of the removing processes such as etching on the stacked layer 310 by using those second mask patterns PR2 as masks, but the invention is not limited thereto. The number of performing the trimming processes and the removing processes may be adjusted according to the design.

In the case where the number of the insulation layers 302 and the sacrificed layers 304 stacked on each other in the stacked layer is small, the second trench 320a may form a trench pattern TP1 as shown in FIG. 1H that separates the first stacked structure SC1 and the second stacked structure SC2 and exposes the etching stop layer 200. However, since the present embodiment is described by taking the insulation layers 302 and sacrificed layers 304 with a large number of layers as an example, performing the patterning processes shown in FIG. 1D to FIG. 1H are required to form the trench pattern TP1 that separates the first stacked structure SC1 and the second stacked structure SC2 and exposes the etching stop layer 200. That is, in the present embodiment, the patterning process performed on the stacked layer 300 may include the first patterning process and the second patterning process described above and a third patterning process and a fourth patterning process described below.

In some embodiments, the third patterning process may include following steps. Firstly, referring to FIG. 1D and FIG. 1E, a third mask pattern PR3 is formed on the stacked layer 320. The third mask pattern PR3 exposes the first sidewall 320a1 of the second trench 320a and covers the second sidewall 310a2 of the second trench 320a. Then, referring to FIG. 1E and FIG. 1F, a portion of the stacked layer 320 is removed by using the third mask pattern PR3 as a mask to form a stacked layer 330 including a third trench 330a. The third trench 330a includes asymmetric first and second sidewalls 330a1 and 330a2. The third mask pattern PR3 is removed after forming the third trench 330a. In some embodiments, the third trench 330a may be formed by using the steps of forming the first trench 310a as described above, that is, the third trench 330a may include the first and second sidewalls 330a1 and 330a2 with staircase profiles. In some embodiments, steps of forming the third trench 330a may include performing three times of the trimming processes on the third mask pattern PR3 and performing four times of the removing processes such as etching on the stacked layer 320 by using those third mask pattern PR3 as masks, but the invention is not limited thereto. The number of performing the trimming processes and the removing processes may be adjusted according to the design.

In some embodiments, the fourth patterning process may include following steps. Firstly, referring to FIG. 1G and FIG. 1G, a fourth mask pattern PR4 is formed on the stacked layer 330. The fourth mask pattern PR4 exposes the first sidewall 330a1 of the third trench 330a and covers the second sidewall 330a2 of the third trench 330a. Then, referring to FIG. 1G and FIG. 1H, a portion of the stacked layer 330 is removed by using the fourth mask pattern PR4 as a mask to form a first stacked structure SC1 disposed above the active elements 14, a second stacked structure SC2 surrounding the first stacked structure SC1, and a trench pattern TP1 separating the first stacked structure SC1 and the second stacked structure SC2 and exposing the etching stop layer 200. The trench pattern TP1 includes asymmetric inner and outer sidewalls TP1a and TP1b. The fourth mask pattern PR4 is removed after forming the trench pattern TP1.

In some embodiments, the trench pattern TP1 may be formed by using the steps of forming the first trench 310a as described above, that is, the trench pattern TP1 may include the inner and outer sidewalls TP1a and TP1b with staircase profiles. In some embodiments, the trench pattern TP1 may include a rectangular pattern as shown in FIG. 2 when viewing from top. In some embodiments, steps of forming the trench pattern TP1 may include performing three times of the trimming processes on the fourth mask pattern PR4 and performing four times of the removing processes such as etching on the stacked layer 330 by using those fourth mask patterns PR4 as masks, but the invention is not limited thereto. The number of performing the trimming processes and the removing processes may be adjusted according to the design. For example, in the case where the number of layers of the stacked layer is large, the surface topology of the top layer of the stacked layer exhibits a large difference in height (e.g., comprising a wave-like surface topology), such that the difference in the thickness of the photoresist applied on the stacked layer is also larger at the high position and the low position. For example, the thickness of the photoresist is thinner at the position where the surface topography is higher, such that the number of layers available for trimming is reduced. Therefore, when the number of layers of the stacked layer exceeds a certain number, the number of times of performing the trimming process and the removing process in the forward part is generally greater than that of performing the trimming process and the removing process in the backward part.

Referring to FIG. 1H and FIG. 2, the first stacked structure SC1 may have staircase structure and may form a 3D memory array in the subsequence processes, therefore, the first stacked structure SC1 may also be referred to an array staircase. The second stacked structure SC2 may have staircase structure and the scribe line may be formed in a region SLR of the second stacked structure SC2 in the subsequence processes, therefore, the second stacked structure SC2 may also be referred to a scribe-line staircase. The trench pattern TP1 may be formed to include asymmetric inner and outer sidewalls TP1a and TP1b by using the steps as described above, such that the occupied area of the scribe-line staircase may be reduced, whereas the occupied area of the array staircase may be increased. As such, it is benefic for reducing the size of the memory structure and increasing the performance of the memory structure. In some embodiments, a seal ring (not illustrated) may be formed in the trench pattern TP1 to surround the array staircase before performing a scribing process thereby preventing the array staircase from being damaged during the scribing process.

In some embodiments, the absolute value of the slope of the outer sidewall TP1b of the trench pattern TP1 is greater than the absolute value of the slope of the inner sidewall TP1a of the trench pattern TP1. In some embodiments, the outer sidewall TP1b of the trench pattern TP1 may include a first staircase profile, whereas the inner sidewall TP1a of the trench pattern TP1 may include a second staircase profile, wherein the number of steps of the first staircase profile is smaller than the number of steps of the second staircase profile. In some embodiments, the height in each step of the first staircase profile is greater than the height in each step of the second staircase profile in the direction D2 perpendicular to the surface of the substrate 100. In some alternative embodiments, as shown in FIG. 3, the trench pattern TP2 may include asymmetric inner and outer sidewalls TP2a and TP2b, wherein the inner sidewall TP2a includes a curve profile, whereas the outer sidewall TP2b includes a staircase profile.

After that, processes such as forming vertical channels (not shown), forming source/drain pillars (not shown), removing the sacrificed layers 304 to form lateral openings (not shown), forming charge storage layers in the lateral openings (not shown), forming gate layers GL on the charge storage layers in the lateral openings to serve as word lines (WL), and the like may be performed on the first stacked structure SC1 to form a 3D memory array MSC shown in FIG. 4.

Hereinafter, the 3D memory structure 1000 of the present embodiment will be described with reference to FIG. 4. In addition, although the 3D memory structure 1000 in the present embodiment is formed by the foregoing method of forming a 3D memory structure, but is not limited thereto.

Referring to FIG. 4, a 3D memory structure 1000 may include a substrate 100, an etching stop layer 200, a 3D memory array MSC, and a second stacked structure SC2. The substrate 100 may include a memory cell region R1 and a peripheral region R2 surrounding the memory cell region R1. The etching stop layer 200 may be disposed on the substrate 100. The 3D memory array MSC may be disposed on the etching stop layer 200 on the memory cell region R1. The 3D memory array MSC may include a first stacked structure SC1. The first stacked structure SC1 may include gate layers GL stacked on each other and electrically isolated from each other. In some embodiments, the gate layers GL may be, for example, electrically isolated from each other by the insulation layers 302 (as shown in FIG. 1H) disposed therebetween. The gate layers GL may include conductive materials such as tungsten (W), cobalt (Co), aluminum (Al), tungsten silicide (WSix), cobalt silicide (CoSix), or the like. The second stacked structure SC2 may be disposed on the etching stop layer 200 and may surround the first stacked structure SC1 of the 3D memory array MSC. The second stacked structure SC2 may include dummy gate layers DGL stacked on each other and electrically isolated from each other. In some embodiments, the dummy gate layers DGL may be, for example, electrically isolated from each other by the insulation layers 302 (as shown in FIG. 1H) disposed therebetween. In some embodiments, since the vertical channels and source/drain pillars are not formed in the second stacked structure SC2, the dummy gate layers DGL may be electrically floating. The dummy gate layers DGL may include conductive materials such as tungsten (W), cobalt (Co), aluminum (Al), tungsten silicide (WSix), cobalt silicide (CoSix), or the like. In some embodiments, the dummy gate layers DGL and the gate layers GL may be formed in the same step simultaneously, so the dummy gate layers DGL and the gate layers GL may have the same materials.

The first stacked structure SC1 may include first sidewalls that face the second stacked structure SC2. The second stacked structure SC2 may include second sidewalls that face the first stacked structure SC1. In some embodiments, the first sidewalls define the inner sidewall TP1a of the trench pattern TP1, and the second sidewalls define the outer sidewall TP1b of the trench pattern TP1. The inner sidewall TP1a and the outer sidewall TP1b are asymmetric. In some embodiments, the absolute value of the slope of the outer sidewall TP1b may be greater than the absolute value of the slope of the inner sidewall TP1a. For example, as shown in FIG. 1H, in the case where the sum of the thickness of one insulation layer and one sacrificed layer (hereinafter an ON layer) in each of the first stacked structure SC1 and the second stacked structure SC2 is 0.1 µm, and the pitch between the ON layers in each of the first stacked structure SC1 and the second stacked structure SC2 is 0.5 µm, the slope of the outer sidewall TP1b is 0.8 (0.1*16/0.5*4), and the slope of the inner sidewall TP1a is 0.2 (0.1*16/0.5*16). In some embodiments, the outer sidewall TP1b may include a curve profile, and the inner sidewall TP1a may include a staircase profile. In some embodiments, the outer sidewall TP1b may include a first staircase profile, and the inner sidewall TP1a may include a second staircase profile, and the number of steps of the first staircase profile may be smaller than the number of steps of the second staircase profile. In some embodiments, the height in each step of the first staircase profile is greater than the height in each step of the second staircase profile in the direction D2 perpendicular to the surface of the substrate 100.

Figure 5:
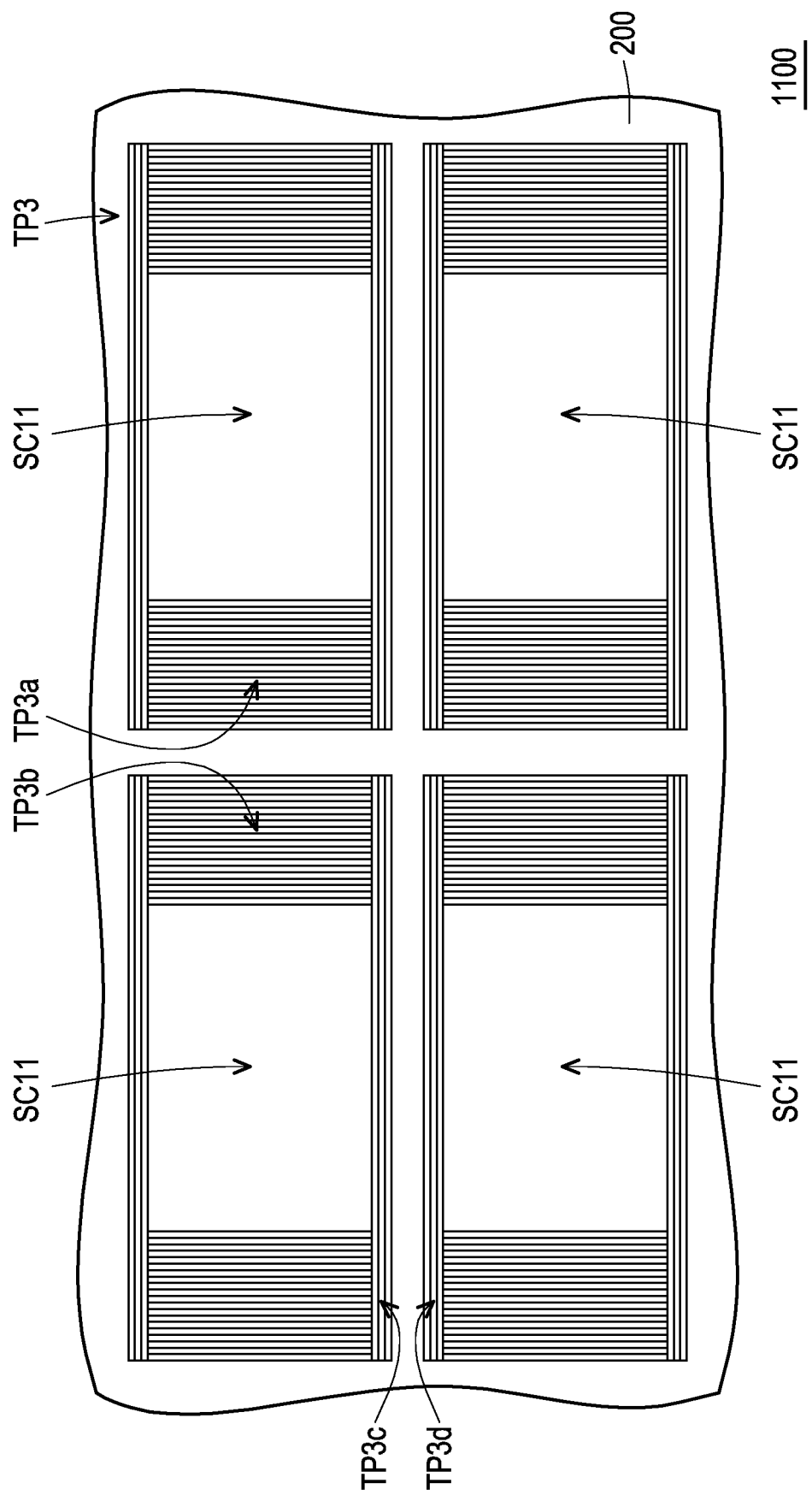
FIG. 5 is a schematic top view illustrating stacked structures inside a chip according to an embodiment of the present invention.

FIG. 5 is a schematic top view illustrating stacked structures inside a chip according to an embodiment of the present invention.

Referring to FIG. 5, stacked structures SC11 inside a chip 1100 may be, for example, formed by a process similar to the process shown in FIG. 1A to FIG. 1H. For example, the stacked structures SC11 may be formed by following steps. Firstly, an etching stop layer 200 may be formed on a substrate (not shown). Next, a stacked layer (being similar to the stacked layer 300 shown in FIG. 1A) is formed on the etching stop layer 200. The stacked layer may include insulation layers (not shown but being similar to the insulation layers 302 shown in FIG. 1A) and sacrificed layers (not shown but being similar to the sacrificed layers 304 shown in FIG. 1A) alternatively stacked on the etching stop layer 200. Then, a patterning process is performed on the stacked layer to form stacked structures SC11 and a trench pattern TP3 separating the stacked structures SC11 and exposing the etching stop layer 200. The trench pattern TP3 includes first sidewalls TP3a and second sidewalls TP3b opposite to each other in the first direction D1 and third sidewalls TP3c and fourth sidewalls TP3d opposite to each other in the second direction D2 perpendicular to the first direction D1. In some embodiments, the first sidewalls TP3a and the second sidewalls TP3b may be, for example, sidewalls where the contacts are formed thereon in the subsequence processes. The third sidewalls TP3c and the fourth sidewalls TP3d may be, for example, sidewalls where the contacts are not formed thereon in the subsequence processes. The contacts may be, for example, word line contacts for electrically connecting the gate layers. The trench pattern TP3 may include a grid pattern when viewing from top.

As shown in FIG. 5, profiles of the first sidewalls TP3a and the second sidewalls TP3b may be different from profiles of the third sidewalls TP3c and the fourth sidewalls TP3d, such that the occupied area of the sidewalls where the contacts are not formed thereon in the stacked structures SC11 can be reduced, and thus the occupied area of the stacked structures SC11 that form 3D memory arrays in the subsequence processes can be increased. As such, it is benefic for reducing the size of the memory structure and increasing the performance (e.g., memory capacity) of the memory structure. In some embodiments, the absolute values of the slopes of the third sidewalls TP3c and the fourth sidewalls TP3d may be greater than the absolute values of the slopes of the first sidewalls TP3a and the second sidewalls TP3b. In some embodiments, the third sidewalls TP3c and the fourth sidewalls TP3d may include curve profiles, whereas the first sidewalls TP3a and the second sidewalls TP3b may include staircase profiles. In some embodiments, the third sidewalls TP3c and the fourth sidewalls TP3d may include first staircase profiles, whereas the first sidewalls TP3a and the second sidewalls TP3b may include second staircase profiles. The number of steps of the first staircase profiles is smaller than the number of steps of the second staircase profiles. In some embodiments, the heights in each step of the first staircase profiles are greater than the heights in each step of the second staircase profiles in a third direction (e.g., a direction perpendicular to the substrate) perpendicular to the first direction D1 and the second direction D2.

In some embodiments, the stacked structures SC11 may be formed by a process similar to the process shown in FIG. 1A to FIG. 1H. That is, a patterning process for forming the stacked structures SC11 may include the first patterning process and the patterning process.

In some embodiments, the first patterning process may include following steps. Firstly, a first mask pattern (not shown) is formed on the stacked layer. Then, a portion of the stacked layer is removed by using the first mask pattern as a mask to form first trenches (not shown). Each of the first trenches may include a first trench sidewall and a second trench sidewall that are symmetric in the first direction D1 and a third trench sidewall and a fourth trench sidewall that are symmetric in the second direction D2. The first mask pattern is removed after forming the first trenches.

In some embodiments, the second patterning process may include following steps. Firstly, a second mask pattern (not shown) is formed on the stacked layer. The second mask pattern exposes the first trench sidewalls and the second trench sidewalls of the first trenches and covers the third trench sidewalls and the fourth trench sidewalls of the first trenches. Then, a portion of the stacked layer is removed by using the second mask pattern as a mask to form the stacked structures SC11 and the trench pattern TP3. The second mask pattern is removed after forming the stacked structures SC11 and the trench pattern TP3. In some embodiments, the steps of forming the trench pattern TP1 as described above can be used to form the trench pattern TP3, but the invention is not limited thereto. The number of performing the trimming processes, the number of performing the removing processes, and the number of the mask patterns used in the processes may be adjusted according to the design.

Figure 6:
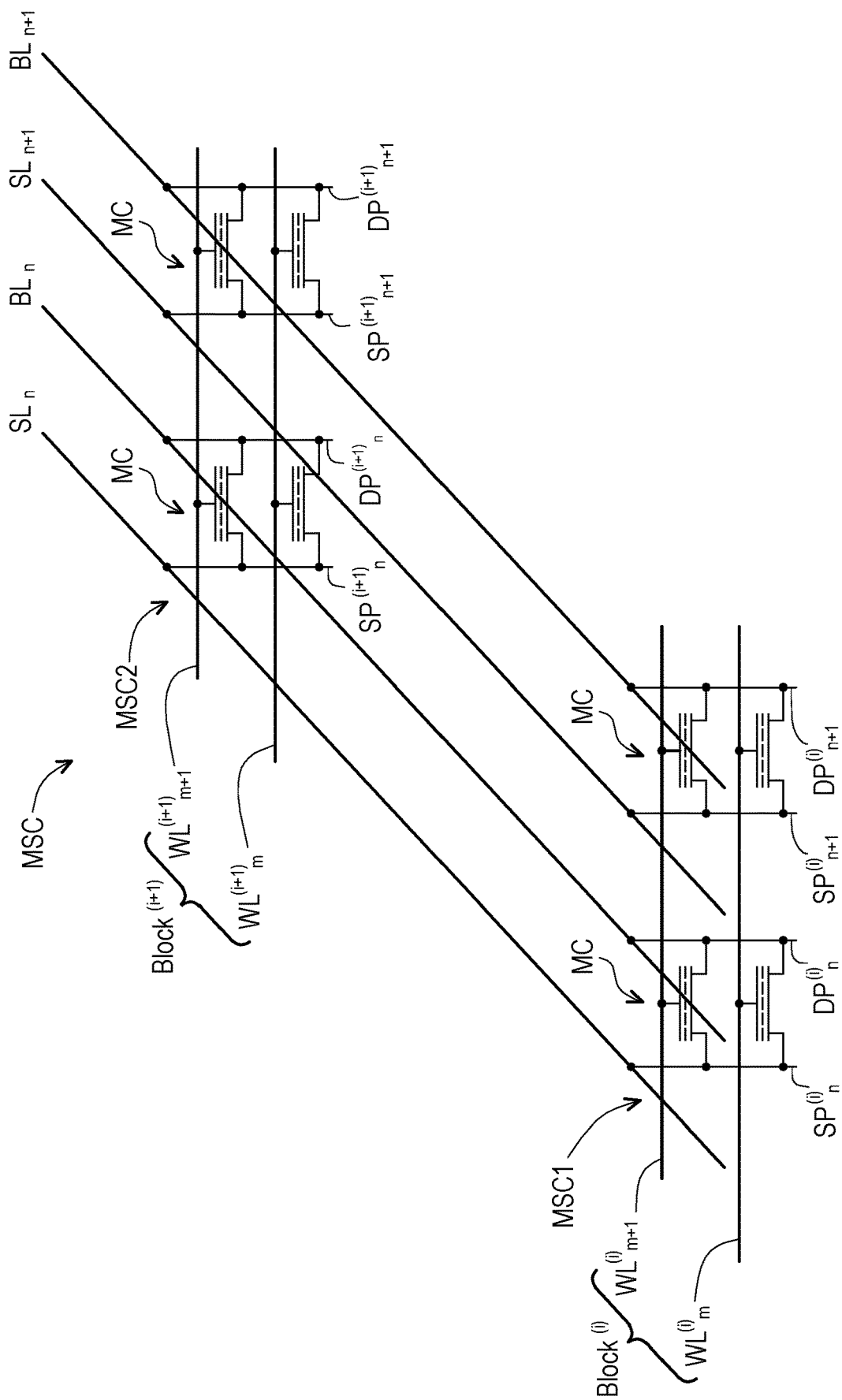
FIG. 6 shows a circuit diagram of a 3D AND flash memory array according to some embodiments in according to the present invention.

Hereinafter, the 3D memory array MSC of the present embodiment will be described with reference to FIG. 6. FIG. 6 shows a circuit diagram of a 3D AND flash memory array according to some embodiments in according to the present disclosure.

FIG. 6 shows a schematic view of two blocks BLOCK$^{(i)}$ and BLOCK$^{(i+1)}$ of a vertical AND memory array MSC arranged in rows and columns. The block BLOCK$^{(i)}$ includes a memory array MSC1. A row (e.g., an (m+1)$^{th}$ row) of the memory array MSC1 is a set of AND memory cells MC having a common word line (e.g., WL$^{(i)}_{m+1}$). The AND memory cells MC of the memory array MSC1 in each row (e.g., the (m+1)$^{th}$ row) correspond to a common word line (e.g., WL$^{(i)}_{m+1}$) and are coupled to different source pillars (e.g., SP$^{(i)}_n$ and SP$^{(i)}_{n+1}$) and drain pillars (e.g., DP(i)n and DP(i)$_{n+1}$), so that the AND memory cells MC are logically arranged in a row along the common word line (e.g., WL$^{(i)}_{m+1}$).

A column (e.g., an $n^{th}$ column) of the memory array MSC1 is a set of AND memory cells MC having a common source pillar (e.g., $SP^{(i)}n$) and a common drain pillar (e.g., $DP(i)_n$). The AND memory cells MC of the memory array MSC1 in each column (e.g., the $n^{th}$ column) correspond to different word lines (e.g., $WL^{(i)}{}_{m+1}$ and $WL^{(i)}m$) and are coupled to a common source pillar (e.g., $SP^{(i)}n$) and a common drain pillar (e.g., $DP(i)_n$). Hence, the AND memory cells MC of the memory array MSC1 are logically arranged in a column along the common source pillar (e.g., $SP^{(i)}n$) and the common drain pillar (e.g., $DP(i)_n$). In the physical layout, according to the manufacturing method as applied, the columns or rows may be twisted and arranged in a honeycomb pattern or other patterns for high density or other reasons.

In FIG. 6, in the block $BLOCK^{(i)}$, the AND memory cells MC in the $n^{th}$ column of the memory array MSC1 share a common source pillar (e.g., $SP^{(i)}{}_n$) and a common drain pillar (e.g., $DP(i)_n$). The AND memory cells MC in an $(n+1)^{th}$ column share a common source pillar (e.g., $SP^{(i)}{}_{n+1}$) and a common drain pillar (e.g., $DP(i)_{n+1}$).

The common source pillar (e.g., $SP^{(i)}{}_n$) is coupled to a common source line (e.g., $SL_n$) and the common drain pillar (e.g., $DP(i)_n$) is coupled to a common bit line (e.g., $BL_n$). The common source pillar (e.g., $SP^{(i)}{}_{n+1}$) is coupled to a common source line (e.g., $SL_{n+1}$) and the common drain pillar (e.g., $DP(i)_{n+1}$) is coupled to a common bit line (e.g., $BL_{n+1}$).

Likewise, the block $BLOCK^{(i+1)}$ includes a memory array MSC2, which is similar to the memory array MSC1 in the block $BLOCK^{(i)}$. A row (e.g., an $(m+1)^{th}$ row) of the memory array MSC2 is a set of AND memory cells MC having a common word line (e.g., $WL^{(i+1)}{}_{m+1}$). The AND memory cells MC of the memory array MSC2 in each row (e.g., the $(m+1)^{th}$ row) correspond to a common word line (e.g., $WL^{(i+1)}{}_{m+1}$) and are coupled to different source pillars (e.g., $SP^{(i+1)}{}_n$ and $SP^{(i+1)}{}_{n+1}$) and drain pillars (e.g., $DP^{(i+1)}{}_n$ and $DP^{(i+1)}{}_{n+1}$). A column (e.g., an $n^{th}$ column) of the memory array MSC2 is a set of AND memory cells MC having a common source pillar (e.g., $SP^{(i+1)}{}_n$) and a common drain pillar (e.g., $DP^{(i+1)}{}_n$). The AND memory cells MC are integrated and connected in parallel, and thus may be also referred to as a memory string. The AND memory cells MC of the memory array MSC2 in each column (e.g., the $n^{th}$ column) correspond to different word lines (e.g., $WL^{(i+1)}{}_{m+1}$ and $WL^{(i+1)}{}_m$) and are coupled to a common source pillar (e.g., $SP^{(i+1)}{}_n$) and a common drain pillar (e.g., $DP^{(i+1)}{}_n$). Hence, the AND memory cells MC of the memory array MSC2 are logically arranged in a column along the common source pillar (e.g., $SP^{(i+1)}{}_n$) and the common drain pillar (e.g., $DP^{(i+1)}{}_n$).

The block $BLOCK^{(i+1)}$ and the block $BLOCK^{(i)}$ share source lines (e.g., $SL_n$ and $SL_{n+1}$) and bit lines (e.g., $BL_n$ and $BL_{n+1}$). Therefore, the source line $SL_n$ and the bit line $BL_n$ are coupled to the $n^{th}$ column of AND memory cells MC in the AND memory array MSC1 of the block $BLOCK^{(i)}$, and are coupled to the $n^{th}$ column of AND memory cells MC in the AND memory array MSC2 of the block $BLOCK^{(i+1)}$. Similarly, the source line $SL_{n+1}$ and the bit line $BL_{n+1}$ are coupled to the $(n+1)^{th}$ column of AND memory cells MC in the AND memory array MSC1 of the block $BLOCK^{(i)}$, and are coupled to the $(n+1)^{th}$ column of AND memory cells MC in the AND memory array MSC2 of the block $BLOCK^{(i+1)}$.

Based on the above, the 3D memory structure and the method of forming the same provided in the above embodiments are designed to include a trench pattern including asymmetric inner and outer sidewalls to reduce the occupied area of the second stacked structure being scribed in the subsequence processes and increase the occupied area of the first stacked structure that forms the 3D memory array in the subsequence processes. As such, it is benefic for reducing the size of the memory structure and increasing the performance (e.g., memory capacity) of the memory structure.

On the other hand, the 3D memory structure and the method of forming the same provided in the above embodiments may be applied to aforementioned 3D AND flash memory as well as other various 3D memories, such as 3D AND flash memory, 3D OR flash memory, or memory including following memory structure: a memory structure where CMOS arranged about the memory array (CMOS and Array, CNA), a memory structure where CMOS arranged under the memory array (CMOS under Array, CUA), or a memory structure with staircase structure in X and/or Y direction.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A 3D memory structure, comprising:
   a substrate comprising a memory cell region and a peripheral region surrounding the memory cell region;
   an etching stop layer disposed on the substrate;
   a 3D memory array disposed on the etching stop layer on the memory cell region, wherein the 3D memory array comprises a first stacked structure comprising gate layers stacked on each other and electrically isolated from each other; and
   a second stacked structure disposed on the etching stop layer and surrounding the first stacked structure of the 3D memory array, wherein the second stacked structure comprises dummy gate layers stacked on each other and electrically isolated from each other,
   wherein the first stacked structure comprises first sidewalls that face the second stacked structure, the second stacked structure comprises second sidewalls that face the first stacked structure, the first sidewalls define an inner sidewall of a trench pattern, and the second sidewalls define an outer sidewall of the trench pattern,
   wherein the inner sidewall and the outer sidewall of the trench pattern are asymmetric, wherein the outer sidewall comprises a curve profile, and the inner sidewall comprises a staircase profile.

2. The 3D memory structure of claim 1, wherein an absolute value of a slope of the outer sidewall is greater than an absolute value of a slope of the inner sidewall.

3. A method of forming a 3D memory structure of claim 1, comprising:
   forming an etching stop layer on a substrate, wherein the substrate comprises an active element;
   forming a stacked layer on the etching stop layer, wherein the stacked layer comprises insulation layers and sacrificed layers alternatively stacked on the etching stop layer; and
   performing a patterning process on the stacked layer to form a first stacked structure disposed above the active element, a second stacked structure surrounding the first stacked structure, and a trench pattern separating the first stacked structure and the second stacked structure and exposing the etching stop layer,
   wherein the trench pattern comprises an inner sidewall and an outer sidewall that are asymmetric, and the inner sidewall defines a sidewall of the first stacked structure, and the outer sidewall defines a sidewall of the second stacked structure that faces the first stacked structure, wherein the outer sidewall comprises a curve profile, and the inner sidewall comprises a staircase profile.

4. The method of claim 3, wherein an absolute value of a slope of the outer sidewall is greater than an absolute value of a slope of the inner sidewall.

5. The method of claim 3, wherein the outer sidewall comprises a curve profile, and the inner sidewall comprises a staircase profile.

6. The method of claim 3, wherein the outer sidewall comprises a first staircase profile, and the inner sidewall comprises a second staircase profile, and the number of steps of the first staircase profile is smaller than the number of steps of the second staircase profile.

7. The method of claim 6, wherein the height in each step of the first staircase profile is greater than the height in each step of the second staircase profile in a direction perpendicular to a surface of the substrate.

8. The method of claim 3, wherein the patterning process comprises a first patterning process and a second patterning process, and
the first patterning process comprises:
forming a first mask pattern on the stacked layer;
removing a portion of the stacked layer by using the first mask pattern as a mask to form a first trench, wherein the first trench comprises a first sidewall and a second sidewall that are symmetric; and
removing the first mask pattern,
the second patterning process comprises:
forming a second mask pattern on the stacked layer, wherein the second mask pattern exposes the first sidewall of the first trench and covers the second sidewall of the first trench; and
removing a portion of the stacked layer by using the second mask pattern as a mask to form the trench pattern comprising the inner sidewall and the outer sidewall.

9. The method of claim 3, wherein the second patterning process comprises etching processes performed on the stacked layer and trimming processes performed on the second mask pattern.

10. The method of claim 3, wherein the trench pattern comprises a rectangular pattern.

11. A method of forming a 3D memory structure of claim 1, comprising:
forming an etching stop layer on a substrate;
forming a stacked layer on the etching stop layer, wherein the stacked layer comprises insulation layers and sacrificed layers alternatively stacked on the etching stop layer; and
performing a patterning process on the stacked layer to form stacked structures and a trench pattern separating the stacked structures and exposing the etching stop layer,
wherein the trench pattern comprises inner sidewalls comprising first sidewalls and second sidewalls opposite to each other in a first direction and outer sidewalls comprising third sidewalls and fourth sidewalls opposite to each other in a second direction perpendicular to the first direction, and
profiles of the first sidewalls and the second sidewalls are different from profiles of the third sidewalls and the fourth sidewalls, wherein the outer sidewalls comprise a curve profile, and the inner sidewalls comprise a staircase profile.

12. The method of claim 11, wherein absolute values of slopes of the third sidewalls and the fourth sidewalls are greater than absolute values of slopes of the first sidewalls and the second sidewalls.

13. The method of claim 11, wherein the third sidewalls and the fourth sidewalls comprise curve profiles, and the first sidewalls and the second sidewalls comprise staircase profiles.

14. The method of claim 11, wherein the third sidewalls and the fourth sidewalls comprise first staircase profiles, and the first sidewalls and the second sidewalls comprise second staircase profiles, and the number of steps of the first staircase profiles is smaller than the number of steps of the second staircase profiles.

15. The method of claim 14, wherein the heights in each step of the first staircase profiles are greater than the heights in each step of the second staircase profiles in a third direction perpendicular to the first direction and the second direction.

16. The method of claim 11, wherein the patterning process comprises a first patterning process and a second patterning process, and
the first patterning process comprises:
forming a first mask pattern on the stacked layer;
removing a portion of the stacked layer by using the first mask pattern as a mask to form first trenches, wherein each of the first trenches comprises first trench sidewalls and second trench sidewalls that are symmetric in the first direction and third trench sidewalls and fourth trench sidewalls that are symmetric in the second direction; and
removing the first mask pattern,
the second patterning process comprises:
forming a second mask pattern on the stacked layer, wherein the second mask pattern exposes the first trench sidewalls and the second trench sidewalls of the first trenches and covers the third trench sidewalls and the fourth trench sidewalls of the first trenches; and
removing a portion of the stacked layer by using the second mask pattern as a mask to form the stacked structures.

17. The method of claim 11, wherein the trench pattern comprises a grid pattern.

* * * * *